US 6,750,716 B2

(12) United States Patent
Cusinato et al.

(10) Patent No.: US 6,750,716 B2
(45) Date of Patent: Jun. 15, 2004

(54) CLASS AB OPERATIONAL AMPLIFIER HAVING HIGH GAIN AND LOW SETTLING TIME

(75) Inventors: Paolo Cusinato, Sestri Levante (IT); Andrea Baschirotto, Tortona (IT); Melchiorre Bruccoleri, Rho (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/162,430

(22) Filed: Jun. 3, 2002

(65) Prior Publication Data
US 2003/0025558 A1 Feb. 6, 2003

(30) Foreign Application Priority Data

Jun. 5, 2001 (IT) .................... TO2001A0538

(51) Int. Cl.[7] ............................... H03F 3/45
(52) U.S. Cl. ....................... 330/260; 330/292
(58) Field of Search ............... 330/260, 292, 330/311

(56) References Cited

U.S. PATENT DOCUMENTS 5,748,040 A * 5/1998 Leung .................... 330/253
6,064,267 A * 5/2000 Lewyn .................... 330/288
6,114,907 A * 9/2000 Sakurai .................. 330/292 X
6,590,452 B1 * 7/2003 Van Rijn ................. 330/260 X

OTHER PUBLICATIONS

Gierkink et al., "Design Aspects of a Rail to Rail CMOS Op Amp" Proc. 1st VLSI Workshop May 6–8, 1997 Columbus Ohio pp. 23–28.*
Castello, R. et al., "A High–Performance Micropower Switched–Capacitor Filter," *IEEE Journal of Solid–State Circuits*, Sc–20(6):1122–1132, Dec. 1985.
Bult, K. et al., "A Fast–Settling CMOS Op Amp for SC Circuits with 90–dB DC Gain," *IEEE Journal of Solid–State Circuits*, 25(6): 1379–1384, Dec. 1990.

* cited by examiner

*Primary Examiner*—Steven J. Mottola
(74) *Attorney, Agent, or Firm*—Lisa K. Jorgenson; David V. Carlson; Seed IP Law Group PLLC

(57) ABSTRACT

The amplifier circuit includes at least one amplification branch having an input transistor, an output transistor, having a source terminal connected to the input terminal and a drain terminal connected to a first output terminal, and a gain raising stage, having an input and an output connected to the source terminal and, respectively, to a gate terminal of the output transistor. The amplifier circuit includes, moreover, a compensation capacitor connected between the gate terminal and the drain terminal of the output transistor.

14 Claims, 4 Drawing Sheets

CLASS AB OPERATIONAL AMPLIFIER HAVING HIGH GAIN AND LOW SETTLING TIME

BACKGROUND OF THE INVENTION

1. Field of the Invention

The present invention relates to a class AB operational amplifier having high gain and low settling time.

2. Description of the Related Art

As is known, speed and accuracy are requirements of primary importance in a great number of analogue electronic circuits, but the optimization of both is difficult, as contrasting needs must be satisfied. In fact, in application such as, for example, switched capacitors circuits, samplers and analogue-to-digital converters of algorithmic, sigma-delta or pipeline type, speed and accuracy depend on the behavior in transient state of the operational amplifiers. In particular, speed requires both a high cutoff frequency and substantially a single pole behavior, whereas it is necessary to increase the DC gain to improve accuracy. The need to raise the cutoff frequency leads to design single-stage amplifiers, preferably implemented with short channel MOS transistors with high bias currents; on the contrary, to obtain a high DC gain it is preferable to use multistage amplifiers, having long channel MOS transistor with low bias currents.

A number of solutions have been proposed to overcome these problems, such as the use of double or triple "cascode" stages, for example. However, although the double "cascode" stages do not impair high frequency performances, they do not allow sufficiently high DC gain values to be reached; triple "cascode" stages, on the other hand, allow a satisfactory gain to be obtained, but they considerably limit both the phase margin and the output dynamics of the operational amplifiers, so they can be used only in a limited field of applications.

Alternatively, transconductance stages can be dynamically biased, by reducing the bias currents according to time. In this case, however, the settling is very slow, so that these circuits are not suitable for use in high frequency applications.

A third solution has been proposed in "A Fast Settling CMOS Op Amp for SC Circuits with 90-dB DC Gain", by K. Bult and G. J. G. M. Geelen, IEEE Journal of Solid-State circuits", Vol. 25, N. 6, pages 1379–1384. In this case, in a "cascode" stage, gain raising stages are used to increase the overall gain of the operational amplifier up to quite high levels (about 90 dB), guaranteeing a high cutoff frequency. However, a drawback of this solution is that a pole-zero doublet is added in the operational amplifier bandwidth. As is known, the time constant of the pole-zero doublet must be lower than the dominant time constant, which determines the cutoff frequency, otherwise the frequency performances may be significantly deteriorated. This limitation is disadvantageous especially when the circuit comprises numerous operational amplifiers, having different working conditions (for example different capacitive and/or resistive loads). In this case, in fact, in order to ensure that in each operational amplifier the time constant of the pole-zero doublet is smaller than the respective dominant time constant, conditions must be imposed which may cause the settling times of the operational amplifiers themselves not to be uniform. Consequently, non linear phenomena may occur which, for example in the case of analogue-to-digital converters of sigma-delta type, can adversely affect the accuracy of the whole device.

BRIEF SUMMARY OF THE INVENTION

The present invention provides an operational amplifier having improved gain with respect to frequency and improved response time with respect to input stimulus.

According to an embodiment of the present invention a class AB operational amplifier having high gain and low settling time is provided by an amplification branch; an input transistor; an output transistor having a source terminal connected to the input transistor and a drain terminal connected to a first output terminal; and a gain raising stage having an input and an output connected to the source terminal and, respectively, to a gate terminal of the output transistor; wherein the gain raising stage includes at least one compensation capacitor connected between the gate terminal and the drain terminal of the output transistor.

BRIEF DESCRIPTION OF THE SEVERAL VIEWS OF THE DRAWINGS

For a better understanding of the invention, an embodiment thereof is now described, purely by way of non-limiting example, with reference to the enclosed drawings, in which.

DETAILED DESCRIPTION OF THE INVENTION

Figure 1:
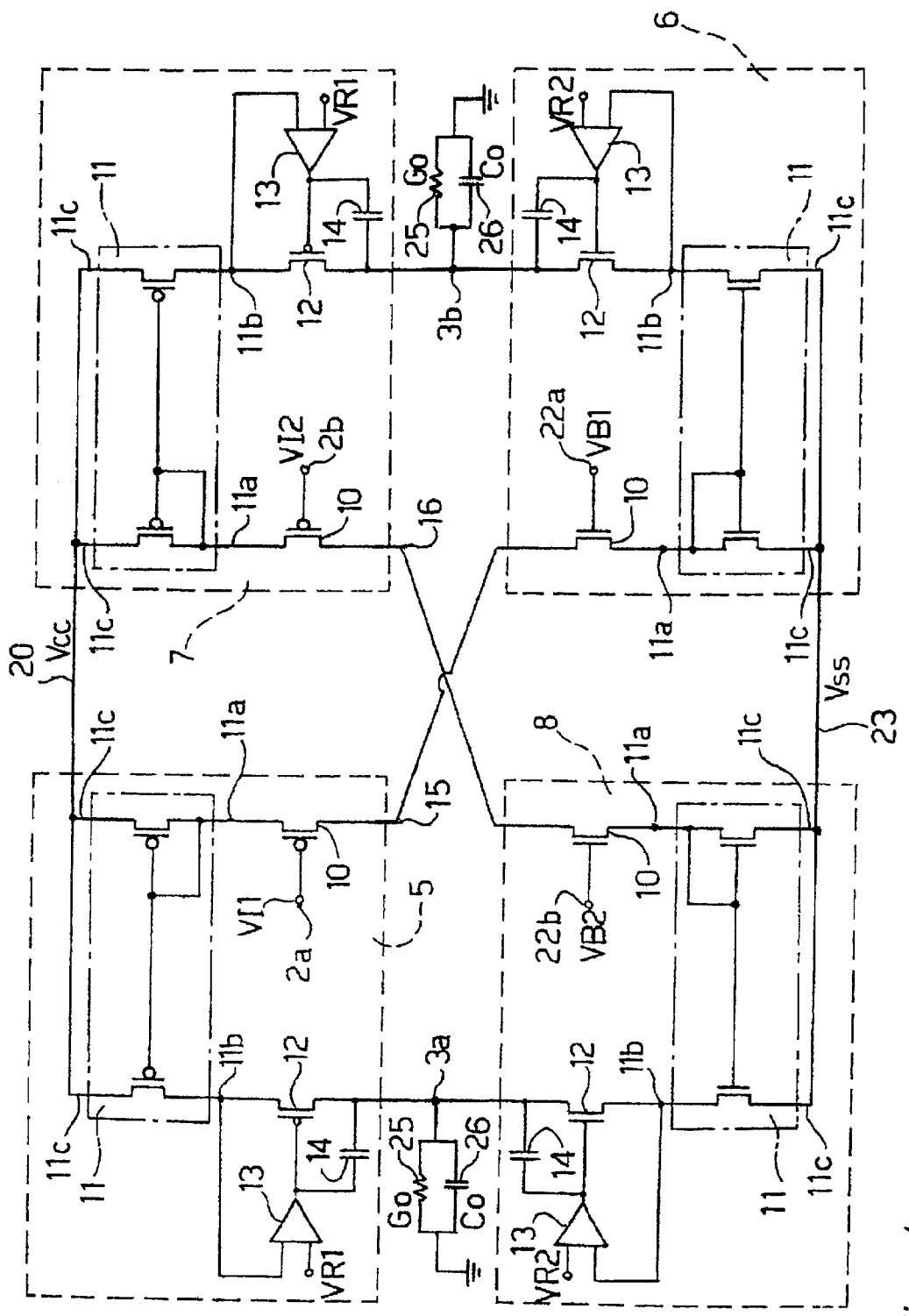
FIG. 1 shows a simplified circuit diagram of an operational amplifier according to the present invention.

With reference to FIG. 1, a fully differential operational amplifier 1 is carried out starting from an amplifying stage of the type described in "A High-performance Micropower Switched Capacitor Filter", by R. Castello, P. R. Gray, in IEEE Journal of Solid-State Circuits, Vol. Sc-20, No. 6, pages 1122–1132.

In particular, the operational amplifier 1, having a first and a second input terminal 2a, 2b and a first and a second output terminal 3a, 3b, comprises a first, a second, a third and a fourth amplification branch 5, 6, 7, 8, connected to each other so as to form a symmetrical circuit. In detail, the first and the second amplification branch 5, 6 have respective connection terminals connected to a first virtual ground node 15, while the third and the fourth amplification branch 7, 8 have respective connection terminals connected to a second virtual ground node 16, Moreover, each of the amplification branches 5–8 comprises an input transistor 10, the drain terminal of which forms the connection terminal of the respective amplification branch 5–8, a current mirror circuit 11, an output transistor 12, a gain raising stage 13 and a compensation capacitor 14, having capacitance Cpz.

In greater detail, each current mirror circuit 11 has a first terminal 11a, connected to the source terminal of the respective input transistor 10, and a second terminal 11b, connected to the source terminal of the respective output transistor 12. Moreover, the input transistors 10 are of the NMOS type in the first and in the third amplification branch 5, 7 and of the PMOS type in the second and in the fourth amplification branch 6, 8; the transistors forming the current mirror circuit 11 and the output transistors 11 are all of the PMOS type in the first and in the third amplification branch 5, 7 and of the NMOS type in the second and in the fourth amplification branch 6, 8. The gate terminals of the input transistors 10 of the first and of the third amplification branch 5, 7 are connected to the first, respectively to the second input 2a, 2b of the operational amplifier 1 and receive a first, respectively a second input voltage V1, V2. The current mirror circuits 11 of the amplification branches 5, 7 have supply terminals 11c connected to a first supply line 20, which supplies a higher supply voltage Vcc.

The gate terminals of the input transistors 10 of the second and of the fourth amplification branch 6, 8 form a first, respectively a second bias terminal 22a, 22b and receive a first, respectively a second bias voltage VB1, VB2. The current mirror circuits 11 of the amplification branches 6, 8 present supply terminals 11c connected to a second supply line 23, which supplies a lower supply voltage Vss.

Each of the gain raising stages 13, described for example in the article already mentioned by Bult and Geelen and preferably comprising circuits of the "folded cascode" type, has a first input 13a receiving a respective reference voltage VR1, VR2, a second input connected to the source terminal of the respective output transistor 12 and an output connected to the gate terminal of the same output transistor 12.

The compensation capacitors 14 are connected between the gate and drain terminals of the respective output transistors 12.

Finally, the output terminals 3a, 3b, to which are connected the drain terminals of the first and of the fourth amplification branch 5, 8 and, respectively, of the second and of the third amplification branch 6, 7, are in turn connected to respective load resistors 25 having conductance Go and load capacitors 26 having capacitance Co.

The presence of the compensation capacitors 14 substantially allows the effects due to the pole-zero doublet in pass band to be eliminated, as shown below.

Figure 2:
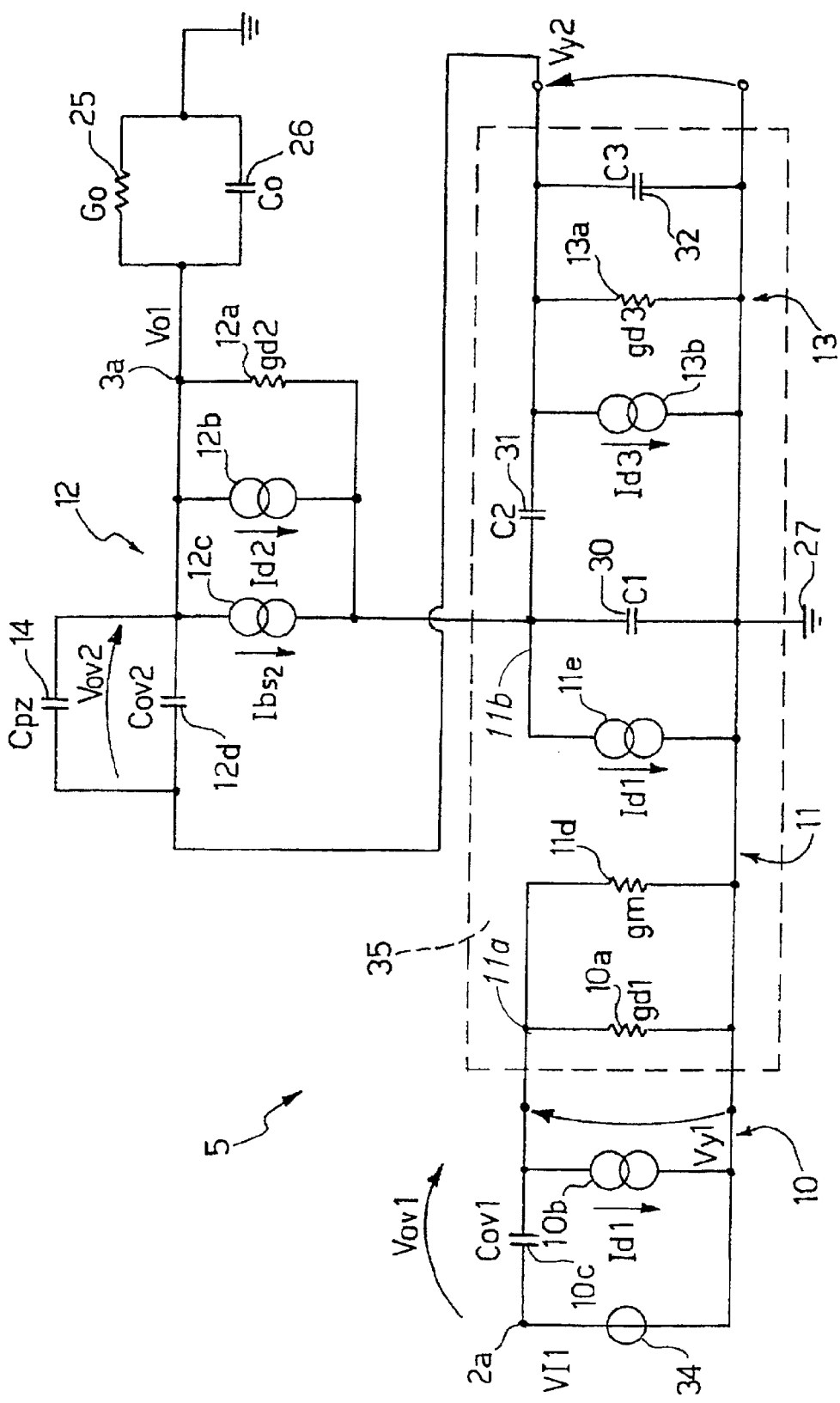
FIG. 2 shows an equivalent small signal diagram of a part of the operational amplifier of FIG. 1.

FIG. 2 shows an equivalent small signal diagram of the first amplification branch 5; given the symmetrical structure of the operational amplifier 1, the considerations that will be proposed may also be immediately extended to the other amplification branches 6–8. For the sake of simplicity in an embodiment of the invention, without this being considered a limitation, that the gain raising stage 13 is composed of a single PMOS transistor having the drain terminal connected to the gate terminal of the output transistor 12 and the gate terminal connected to the second terminal 11b of the current mirror circuit 11. Moreover, the first virtual ground node 15 and the supply line 20, the voltage of which does not vary, are represented here by a reference line 27 with constant potential.

In particular, in FIG. 2 the following are shown:

regarding the input transistor 10, a resistor 10a having channel conductance gd1, a transconductance generator 10b supplying a current Id1 equal to gm1*VI1, where gm1 is the transconductance of the input transistor 10, and a gate-drain parasite capacitor 10c having capacitance Cov1;

regarding the current mirror 11, a resistor 11d having conductance gm, and a transconductance generator 11e, also supplying the current Id1;

regarding the output transistor 12, a resistor 12a having channel conductance gd2, a transconductance generator 12b supplying a current Id2 equal to gm2*Vgs2, where gm2 and Vgs2 are the transconductance and, respectively, the gate-source voltage of the output transistor 12, a transconductance generator 12c supplying a current Ibs2 equal to n*gm2*Vbs2 (Vbs2 being the source-substrate voltage of the output transistor 12) and a gate-drain parasite capacitor 12d having capacitance Cov2 wherein an output voltage Vo1 is supplied as shown in FIG. 2.

regarding the transistor forming the gain raising stage 13, a resistor 13a having channel conductance gd3 and a transconductance generator 13b supplying a current Id3 equal to gm3*Vgs3, where gm3 and Vgs3 are the transconductance and, respectively, the gate-source voltage of the transistor forming the gain raising stage 13;

the compensation capacitor 14, connected between the gate and drain terminals of the output transistor 12;

a parasite capacitor 30 with capacitance C1, connected between the source terminal of the output transistor 12 and the reference line 27;

a parasite capacitor 31 with capacitance C2, connected between the gate and drain terminals of the transistor forming the gain raising stage 13;

a parasite capacitor 32 with capacitance C3, connected between the drain and source terminals of the transistor forming the gain raising stage 13;

a voltage generator 34 supplying the first input voltage VI1; and the load resistor 25 and the load capacitor 26.

Moreover, in FIG. 2 is indicated a quadruple circuit 35 having input voltage Vy1, output voltage Vy2 and admittance matrix Yij defined by the following equations:

$Y11 = gd1 + j\omega(C2 + C1)$ $Y22 = gd3 + j\omega(C3 + C2)$ $Y12 = -j\omega C2$ $Y21 = -j\omega C2 + gm3$ The equations of the circuit in FIG. 2 are as follows:

$-gm1*VI1 + gm2*Vgs2 + n*gm2*Vbs2 - gd2*Vgd2 +$ $-Y11*Vy1 - Y12*Vy2 - j\omega*Cov1*Vov1 = 0;$ $Vy1 = Vgd2 + Vo1;$ $Vo1 = Vov2 + Vy2;$ $-(Go + j\omega Co)Vo1 - gm2*Vgs2 - n*gm2*Vbs2 +$ $-gd2*vgd2 - g\omega(C2 + Cpz)Vov2 = 0;$ $VI1 + Vov1 = Vy1$ $Vbs2 = -Vy1;$ $Vy1 = A*Vy2 - j\omega B(C2 + Cpz)Vov2;$ $Vgs2 = Vy2 - Vy1$ in which the values A and B are defined by the equations:

$$A = -\frac{Y22}{Y21} = \frac{gd3 + j\omega(C2 + C3)}{j\omega C2 - gm3};$$

$$B = -\frac{1}{Y21} = \frac{1}{j\omega C2 - gm3}$$

Figure 3:
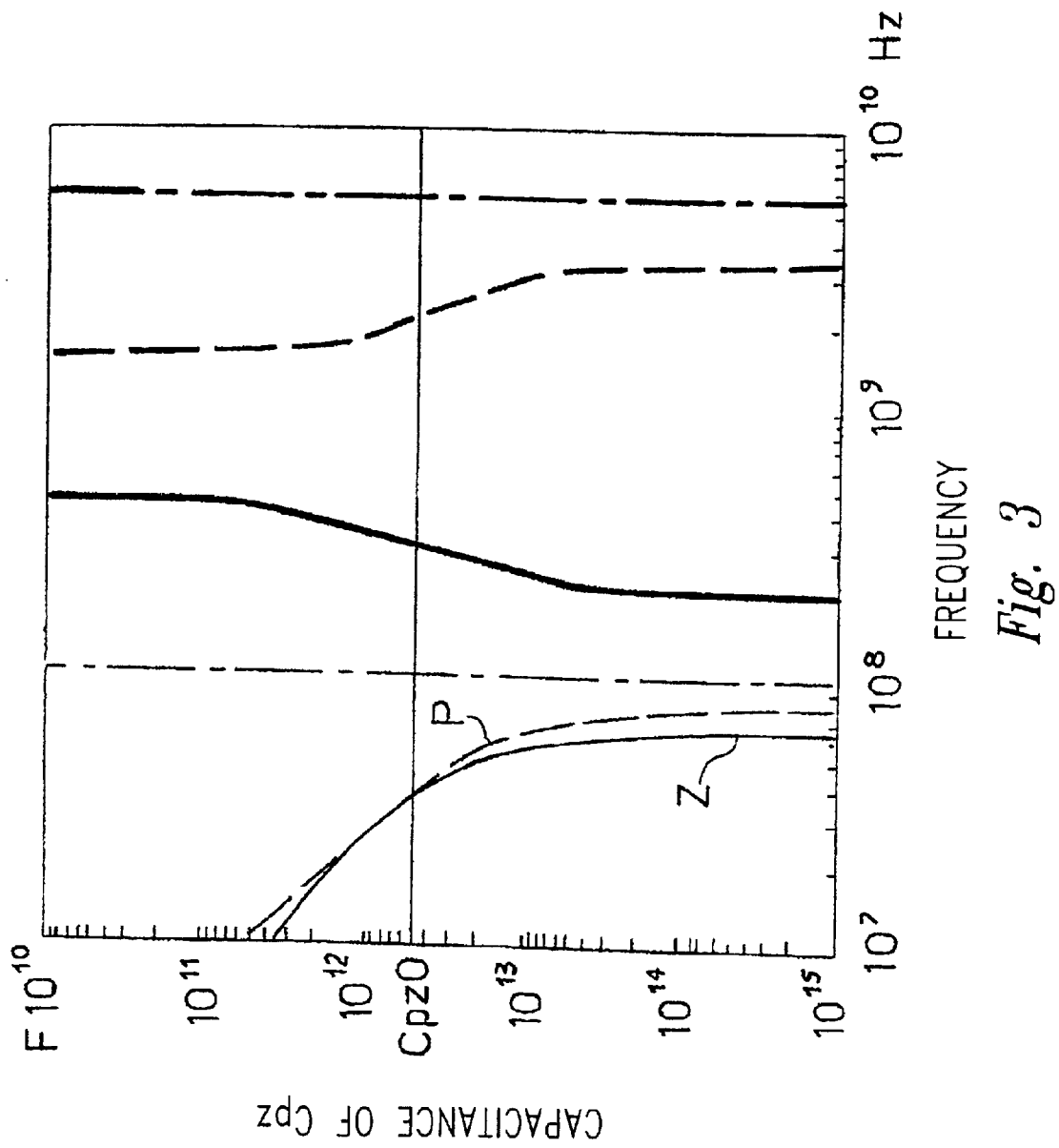
FIGS. 3–5 show plots of quantities relating to the operational amplifier in FIG. 1.

FIG. 3 shows the root locus of the circuit of FIG. 2 as a function of the compensation capacity Cpz. In particular, it is noted that for values of the compensation capacity Cpz close to a value Cpz0, the pole P and the zero Z which form the pole-zero doublet in pass band are compensated. In this way, the effect of the pole-zero doublet is practically cancelled and the output voltage Vo1 substantially shows a single-pole behavior (the same applies to the output voltage Vo2). Further, the compensation capacitor Cpz provides a substantially stable gain at the output of the amplifier in a range of increased frequency.

Figure 5:
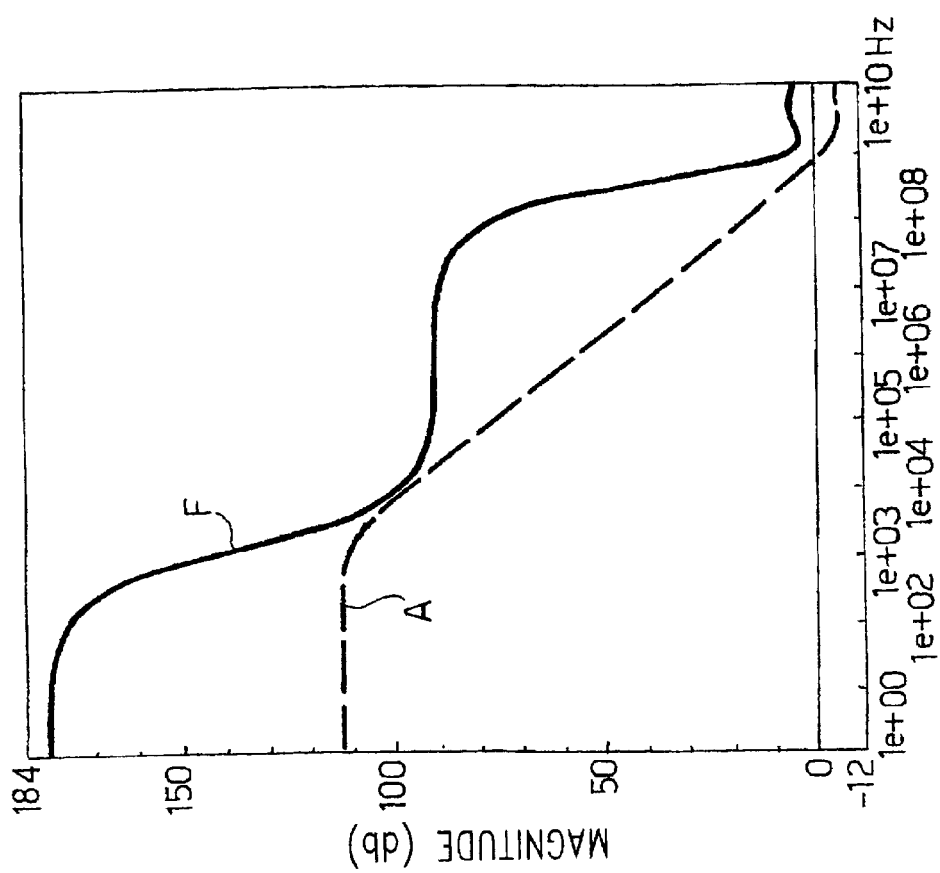
Figure 4:
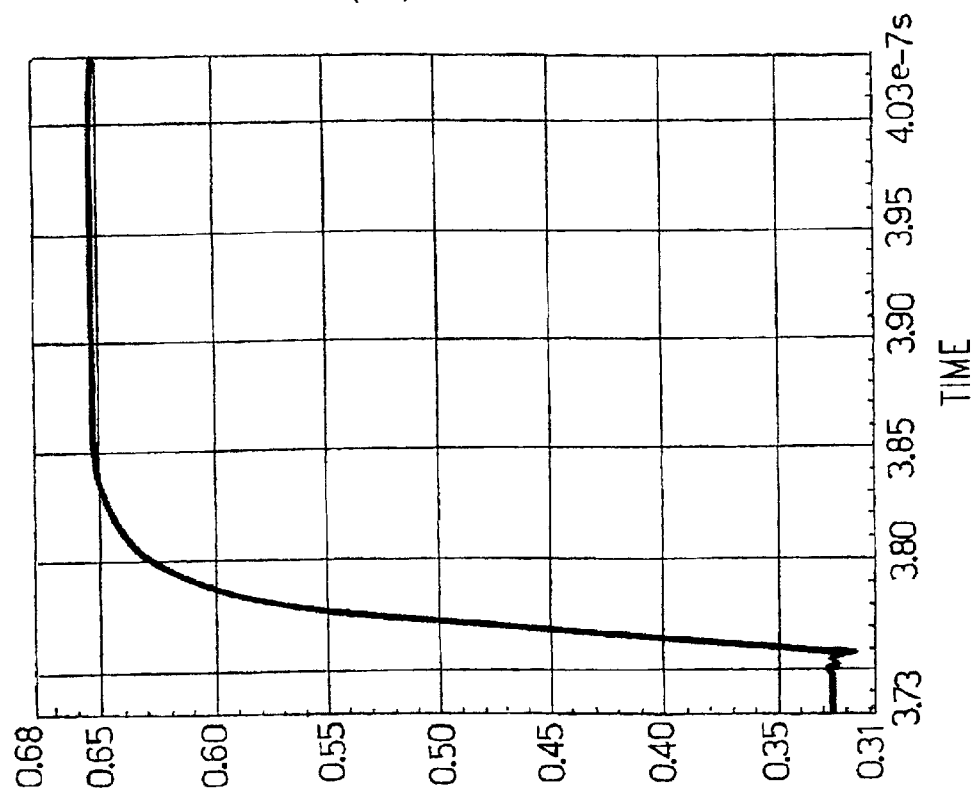

This may be clearly seen from FIGS. 4 and 5, which experimentally show the behavior of the output voltage Vo1 in response to a step input voltage and, respectively, the Bode diagrams of the amplitude A and of the phase F when a compensation capacitor 14 having capacitance equal to Cpz0 is used.

The invention therefore allows the use of gain raising stages, avoiding the problems linked with the presence of a pole-zero doublet in the bandwidth of the operational amplifier 1: in particular, also in devices which require the use of numerous operational amplifiers, it is possible to obtain uniform settling times, so that the accuracy of the devices themselves is not impaired. Moreover, the performances of each operational amplifier are improved, since very high DC gains (of around 110–120 dB) and cutoff frequencies higher than 250 MHz can be obtained.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A class AB amplifier circuit having at least one first amplification branch; comprising:
    an input transistor;
    an output transistor having a source terminal connected to said input transistor and a drain terminal connected to a first output terminal; and
    a gain raising stage having an input and an output connected respectively to the source terminal and to a gate terminal of said output transistor;
    wherein the gain raising stage includes at least one compensation capacitor connected between said gate terminal and said drain terminal of said output transistor.

2. The amplifier circuit according to claim 1, wherein the amplification branch comprises a current mirror circuit having a first terminal connected to a drain terminal of said input transistor and a second terminal connected to the source terminal of said output transistor.

3. The amplifier circuit according to claim 1, wherein the amplifier comprises a second output terminal and, moreover, a second, a third and a fourth amplification branch, each including respective input transistors, output transistor, gain raising stages and compensation capacitors; said first, second, third and fourth amplification branch being connected to one another in couples in order to form a symmetrical circuit with completely differential topology.

4. An amplifier circuit comprising:
    a first circuit having a first transistor and a second transistor, the first transistor having an input terminal for an input signal, and a first terminal coupled to a first terminal of the second transistor;
    a gain circuit having a first input coupled to the first terminal of the second transistor, a second input terminal coupled to a reference voltage, and an output terminal coupled to a control terminal of the second transistor; and
    a compensation circuit element coupled between the output of the gain circuit and a second terminal of the second transistor to provide a negative voltage response from the input voltage.

5. An amplifier device having a compensated gain comprising:
    a first circuit coupled to a current source and including an input transistor having first, second and control terminals, and an output transistor having first, second and control terminals such that the first terminal of the output transistor is coupled to a terminal of the current source, the first terminal of the input transistor is coupled to the terminal of the current source and the control terminal of the output transistor is coupled to a signal;
    a second circuit having first and second input terminals and an output terminal wherein the first input of the second circuit is coupled to a reference voltage, the second input of the second circuit is coupled to the first terminal of the output transistor of the first circuit; and
    a gain compensation element coupled between the second terminal of the output transistor of the first circuit and the output of the second circuit.

6. The amplifier device according to claim 5 wherein the gain compensation element forms a pole at a first frequency greater than a zero at a second frequency such that the compensated gain is substantially constant beyond the first frequency.

7. The amplifier device according to claim 6 wherein the gain compensation element is a capacitor.

8. The amplifier device according to claim 5 wherein the current source is first and second transistors wherein the gates of each transistor are coupled together, a first terminal of the first and the second transistors are coupled to a first supply, a second terminal of the first transistor is coupled to the input transistor.

9. An amplification device comprising:
    a first input stage including a first current source having first and second outputs, including an input transistor having a first terminal coupled to the first output of the first current source, having a second terminal coupled to a first virtual ground node and a control terminal receiving a first input signal, including a second transistor having a first terminal coupled to the second output of the current source, a second terminal coupled to a first output load, and a control terminal coupled an output of a biasing circuit having a first input coupled to the second terminal of the second transistor and a second input coupled to a first reference voltage, and including a first compensation element coupled between the first terminal of the second transistor and the control terminal of the second transistor;
    a second bias stage including a second current source having first and second outputs, including an bias transistor having a first terminal coupled to the first output of the second current source, having a second terminal coupled to the first virtual ground node and a control terminal receiving a first bias voltage, including a second transistor having a first terminal coupled to the second output of the second current source, a second terminal coupled to a second output load, and a control terminal coupled an output of a biasing circuit having a first input coupled to the second terminal of the second transistor and a second input coupled to a second reference voltage, and including a second compensation element coupled between the first terminal of the second transistor and the control terminal of the second transistor;

a second input stage including a third current source having first and second outputs, including an input transistor having a first terminal coupled to the first output of the third current source, having a second terminal coupled to a second virtual ground node and a control terminal receiving a second input signal, including a second transistor having a first terminal coupled to the second output of the current source and a second terminal coupled to the second output load, and a control terminal coupled to an output of third biasing circuit having a first input coupled to the second terminal of the second transistor and a second input coupled to the second reference voltage, and including a third compensation element coupled between the first terminal of the second transistor and the control terminal of the second transistor; and a second bias stage including a fourth current source having first and second outputs, including an input transistor having a first terminal coupled to the first output of the fourth current source, having a second terminal coupled to the second virtual ground node and a control terminal receiving a second bias voltage, including a second transistor having a first terminal coupled to the second output of the fourth current source, a second terminal coupled to the first output load, and a control terminal coupled an output of a fourth biasing circuit having a first input coupled to the second terminal of the second transistor and a second input coupled to the second reference voltage, and including a fourth compensation element coupled between the first terminal of the second transistor and the control terminal of the second transistor.

10. The amplification device according to claim 9 wherein the compensation element is a capacitor.

11. The amplification device according to claim 9 wherein the compensation element defines a pole at a first frequency greater than a zero at a second frequency such that the compensated gain is substantially constant beyond the first frequency.

12. The amplification device according to claim 9 wherein the first, second, third and fourth compensation elements are each a capacitor having substantially equal values.

13. A class AB amplifier circuit having at least one first amplification branch, comprising:

an input transistor;

an output transistor having a first terminal coupled to said input transistor and a second terminal coupled to a first output terminal; and a gain raising stage having an input and an output coupled respectively to the first terminal and to a control terminal of said output transistor;

wherein the gain raising stage includes at least one compensation capacitor electrically coupled between said control terminal and said second terminal of said output transistor.

14. The amplifier circuit according to claim 13 wherein said first terminal is a source terminal of an MOS transistor, and said second terminal is a drain terminal of said MOS transistor.

* * * * *